(12) United States Patent
Kwon et al.

(10) Patent No.: US 11,335,392 B2
(45) Date of Patent: May 17, 2022

(54) MEMORY DEVICES INCLUDING PROCESSING ELEMENTS, AND MEMORY SYSTEMS INCLUDING MEMORY DEVICES

(71) Applicant: Samsung Electronics Co., Ltd., Suwon-si (KR)

(72) Inventors: Youngcheon Kwon, Hwaseong-si (KR); Sanghyuk Kwon, Seoul (KR); Kyomin Sohn, Yongin-si (KR); Jaeyoun Youn, Seoul (KR); Haesuk Lee, Seongnam-si (KR)

(73) Assignee: Samsung Electronics Co., Ltd.

( * ) Notice: Subject to any disclaimer, the term of this patent is extended or adjusted under 35 U.S.C. 154(b) by 42 days.

(21) Appl. No.: 16/903,055

(22) Filed: Jun. 16, 2020

(65) Prior Publication Data

US 2021/0134345 A1 May 6, 2021

(30) Foreign Application Priority Data

Nov. 1, 2019 (KR) .......................... 10-2019-0138775

(51) Int. Cl.
*G11C 11/406* (2006.01)
*G11C 11/408* (2006.01)

(52) U.S. Cl.
CPC ........ *G11C 11/406* (2013.01); *G11C 11/4085* (2013.01)

(58) Field of Classification Search
CPC .................................................... G11C 11/406
USPC ........................................................ 711/106
See application file for complete search history.

(56) References Cited

U.S. PATENT DOCUMENTS

| 6,147,921 | A | 11/2000 | Novak et al. |
| 6,381,188 | B1 | 4/2002 | Choi et al. |
| 8,169,233 | B2 | 5/2012 | Ferolito et al. |
| 9,043,559 | B2 | 5/2015 | Radovic et al. |
| 9,053,811 | B2 | 6/2015 | Coteus et al. |
| 9,281,046 | B2 | 3/2016 | Brandl |
| 2003/0218930 | A1* | 11/2003 | Lehmann .......... G11C 11/40622 365/222 |
| 2012/0239907 | A1 | 9/2012 | Kirsch |
| 2013/0254475 | A1* | 9/2013 | Perego .................. G11C 11/406 711/106 |
| 2016/0098216 | A1* | 4/2016 | Huang ................ G06F 11/1072 714/37 |
| 2019/0139596 | A1* | 5/2019 | Jang .................... G11C 11/4087 |
| 2020/0321049 | A1* | 10/2020 | Meier ............... G11C 11/40615 |

FOREIGN PATENT DOCUMENTS

| JP | H0785357 | 9/1995 |
| KR | 10-0355226 | 9/2002 |

* cited by examiner

*Primary Examiner* — Muna A Techane
(74) *Attorney, Agent, or Firm* — Myers Bigel, P.A.

(57) ABSTRACT

A memory device according to some aspects of the inventive concepts includes a memory cell array including a plurality of banks, at least one Processing Element (PE) connected to at least one bank selected from the plurality of banks, and a control logic configured to control an active operation in which wordlines included in each of the plurality of banks is activated, and configured to control a refresh operation in which at least one bank is refreshed, based on a PE enable signal configured to selectively enable the at least one PE.

20 Claims, 17 Drawing Sheets

FIG. 6

| BA | | PE disable mode | PE enable mode |
|---|---|---|---|
| BA1 | BA0 | BANK | BANK |
| 0 | 0 | A | A/B/C/D |
| 0 | 1 | B | |
| 1 | 0 | C | |
| 1 | 1 | D | |

TA1

MEMORY DEVICES INCLUDING PROCESSING ELEMENTS, AND MEMORY SYSTEMS INCLUDING MEMORY DEVICES

CROSS-REFERENCE TO RELATED APPLICATION

This application claims the benefit of priority under 35 U.S.C. § 119 of Korean Patent Application No. 10-2019-0138775, filed on Nov. 1, 2019, in the Korean Intellectual Property Office, the disclosure of which is incorporated by reference herein in its entirety.

BACKGROUND

The present disclosure relates to memory devices, and more particularly, to memory devices including a Processing Elements (PE) and to memory systems including such memory devices.

In a general computer system, a host accesses a memory device to perform a computational operation on data stored in the memory device. Recently, in accordance with increasing performance requirements for computer systems, memory devices such as Processing In Memory or Processor In Memory (PIM) have been developed to perform some of the computational operations of a host through internal processing. Such a memory device may include a memory cell array and a PE. For example, the memory cell array may include Dynamic Random Access Memory (DRAM) cells. Since a DRAM cell is a memory that determines data by charge stored in a capacitor, a refresh operation is periodically performed to maintain data stored in the DRAM cell.

SUMMARY

According to some aspects of the inventive concepts, there is provided a memory device including a memory cell array including a plurality of banks, at least one Processing Element (PE) connected to at least one bank selected from the plurality of banks, and a control logic configured to control an active operation in which at least one wordline included in each of the plurality of banks is activated and configured to control a refresh operation in which at least one bank of the plurality of banks is refreshed, based on a PE enable signal configured to enable selectively the at least one PE.

According to some aspects of the inventive concepts, there is provided a memory device including a memory cell array including a plurality of banks, a plurality of Processing Elements (PEs) respectively connected to the plurality of banks, a refresh control unit generating refresh signals for controlling refresh operations respectively on the plurality of banks, and an active control unit activating a wordline included in at least one selected bank from the plurality of banks according to an active command and according to the refresh signals during a PE enable mode in which the plurality of PEs are enabled.

According to another aspect of the inventive concept, there is provided a memory system including a memory device including a plurality of banks and a plurality of Processing Elements (PEs), and a memory controller providing the memory device with an active command and a refresh command, wherein the memory device activates wordlines included in each of the plurality of banks in response to receiving the active command during a PE enable mode in which the plurality of PEs are enabled.

BRIEF DESCRIPTION OF THE DRAWINGS

Aspects of the present disclosure will be more clearly understood from the following detailed description taken in conjunction with the accompanying drawings in which:

FIG. 6 illustrates a bank selection table according to some embodiments of the inventive concepts;

DETAILED DESCRIPTION

Hereinafter, aspects of the inventive concepts and some examples of embodiments thereof will be described in detail with reference to the accompanying drawings.

Figure 1:
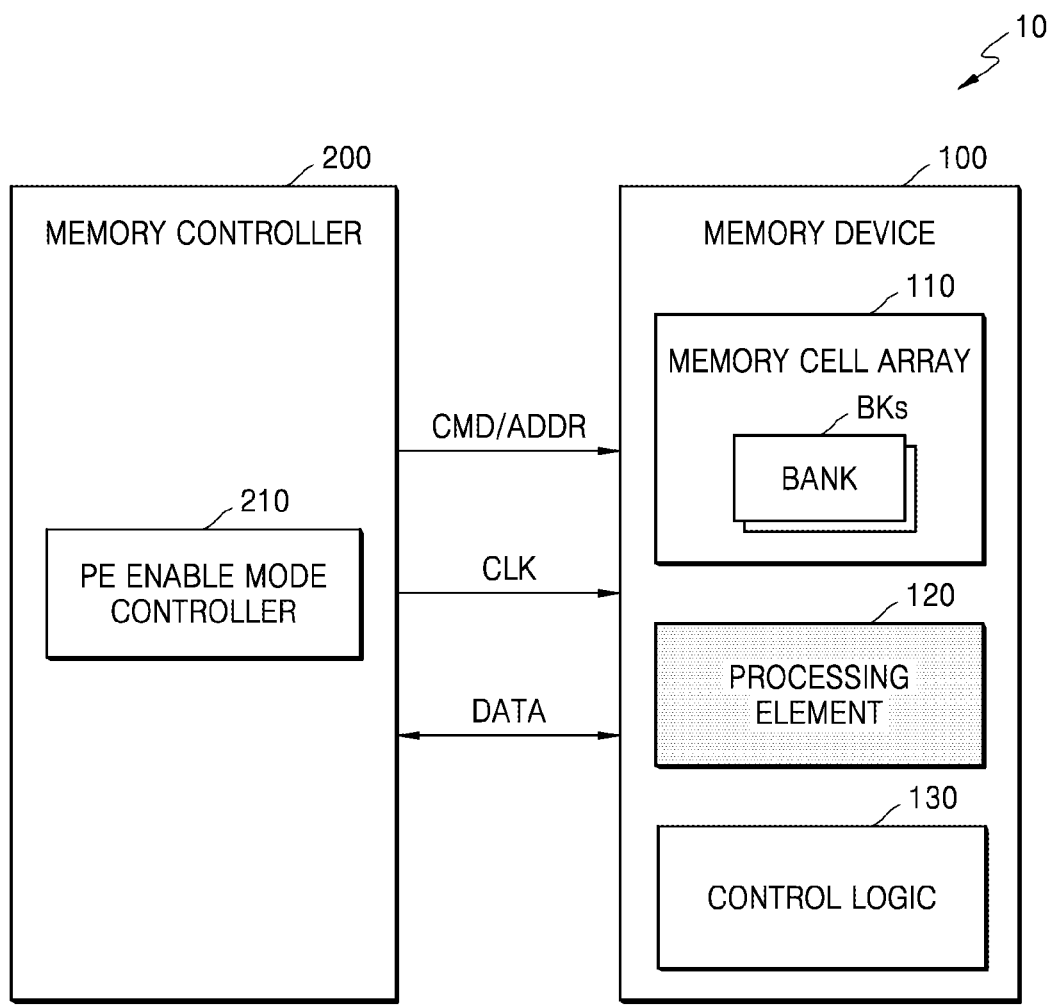
FIG. 1 is a block diagram illustrating a memory system according to some embodiments of the inventive concept.

FIG. 1 is a block diagram illustrating a memory system 10 according to some embodiments of the inventive concepts.

Referring to FIG. 1, the memory system 10 may include a memory device 100 and a memory controller 200. The memory device 100 may include a memory cell array 110, a Processing Element (PE) 120, and a control logic 130. The memory controller 200 may include a PE enable mode controller 210. In some embodiments, the memory device 100 may be implemented as a memory chip or a memory module, and the memory controller 200 may be implemented as part of a host. In some embodiments, the memory device 100 and the memory controller 200 may be implemented together in one memory module.

The memory controller 200 may control normal memory operations, such as a write operation, a read operation, and the like, on the memory cell array 110 by providing the memory device 100 with various types of signals. In detail, the memory controller 200 may write data DATA to the memory device 100 or may read data DATA from the memory device 100 by providing the memory device 100 with a command CMD and an address ADDR. The memory controller 200 may further provide the memory device 100 with a clock signal CLK.

The command CMD may include an active command (e.g., ACT1 of FIG. 4) for changing the memory cell array 110 to an active state to write or read data. The memory device 100 may activate a row included in the memory cell array 110, i.e., a wordline, in response to the active command. Also, the command CMD may include a precharge command (e.g., PRECHARGE1 of FIG. 4) for changing the memory cell array 110 from the active state to a standby state after writing or reading of data is completed. In addition, the command CMD may include a refresh command (e.g., BANK_A REF of FIG. 4) for controlling a refresh operation on the memory cell array 110.

The memory controller 200 may control an internal processing operation through the PE 120 by providing the memory device 100 with various types of signals. In some embodiments, the memory controller 200 may determine a PE enable mode to control the internal processing operation of the PE 120, and the memory controller 200 may generate a PE enable command indicating the PE enable mode according to the determined PE enable mode. In some embodiments, the memory controller 200 may provide the memory device 100 with a signal indicating the PE enable mode through a combination of the command CMD, the address ADDR, and/or the clock signal CLK.

In some embodiments, the memory controller 200 may include the PE enable mode controller 210. The PE enable mode controller 210 may determine the PE enable mode for enabling an operation of the PE 120. The PE enable mode controller 210 may be implemented as hardware and/or software. For example, in some embodiments the memory controller 200 may include a memory (not shown in FIG. 1), with the memory loaded with instructions for embodying the PE enable mode controller 210. The memory controller 200 may also include a processor (not shown in FIG. 1), with the processor configured to perform a PE enable mode control operation by accessing the memory to execute the instructions.

The memory device 100 may include various types of memories, for example, may include Dynamic Random Access Memory (DRAM) such as Double Data Rate Synchronous Dynamic Random Access Memory (DDR SDRAM), Low Power Double Data Rate (LPDDR) SDRAM, Graphic Double Data Rate (GDDR) SDRAM, Rambus Dynamic Random Access Memory (RDRAM), and the like. However, embodiments of the inventive concepts are not limited thereto, and, for example, the memory device 100 may include a nonvolatile memory such as flash memory, Magnetic RAM (MRAM), Ferroelectric RAM (FeRAM), Phase change RAM (PRAM), Resistive RAM (ReRAM), and the like.

The memory cell array 110 may include a plurality of banks BKs, and each of the plurality of banks BKs may include a plurality of memory cells. In detail, the plurality of memory cells may be respectively located at points where a plurality of wordlines and a plurality of bitlines intersect with each other. The memory cell array 110 may store internal processing data. Here, the internal processing data may include data on which a computational operation is to be performed by the PE 120 and/or data that is generated as a result of performing the computational operation by the PE 120.

The PE 120 may perform a data operation on data stored in the memory cell array 110 and/or data received from the memory controller 200. The PE 120 may store a result of the data operation in the memory cell array 110 or may provide the memory controller 200 with the result of the data operation. Therefore, the PE 120 may also be referred to as an operational unit or Processor In Memory (PIM). For example, the PE 120 may be an Arithmetic Logic Unit (ALU) or Multiply-Accumulator (MAC). In some embodiments, PE 120 may be configured to perform data operations such as data invert, data shift, data swap, data compare, and the like; logical operations such as AND, XOR, and the like; and/or mathematical operations, such as addition, subtraction, and the like.

The PE 120 may include a plurality of PEs. In some embodiments, the number of the plurality of PEs may equal or be the same as the number of the plurality of banks BKs included in the memory cell array 110. Here, each of the plurality of PEs may access a corresponding or respective bank to perform a data operation. In some embodiments, the number of the plurality of PEs may be less than the number of the plurality of banks BKs included in the memory cell array 110. Here, each of the plurality of PEs may access at least two corresponding banks to perform a data operation. For example, two adjacent banks may share one PE. For example, a bank group including a plurality of banks may share one PE. However, the inventive concepts are not limited thereto, and in some embodiments the memory device 100 may include one PE 120, and the one PE 120 may access a plurality of banks BKs to perform a data operation.

The control logic 130 may control an active operation activating at least one wordline selected from wordlines included in each of the plurality of banks BKs, based on a PE enable signal. In detail, the control logic 130 may activate wordlines included in each of the plurality of banks BKs in response to the active command in the PE enable mode in which the PE enable signal is activated. Therefore, since PEs connected to the plurality of banks BKs may perform data operations, a data operation speed may be improved. The control logic 130 may activate a wordline included in one of the plurality of banks BKs in response to the active command in a PE disable mode in which the PE enable signal is inactivated.

Also, the control logic 130 may control the active operation activating at least one wordline selected from wordlines included in each of the plurality of banks BKs and a refresh operation on the plurality of banks BKs, on based on the PE enable signal and a refresh signal. In detail, the control logic 130 may determine banks on which the refresh operation is not performed, among the plurality of banks BKs, based on the refresh signal. The control logic 130 may activate wordlines included in each of the banks on which the refresh operation is not performed, among the plurality of banks BKs, in response to the active command in the PE enable mode in which the PE enable signal is activated. Therefore, even when the refresh operation is performed on a few banks among the plurality of banks BKs, as many wordlines as possible may be activated, thereby preventing performance degradation of the memory device 100 and the memory system 10 including the same in the PE enable mode.

Also, the control logic 130 may transmit, to the PE 120, information about a bank on which the refresh operation is performed, in the PE enable mode. Therefore, the PE 120 may perform a data operation on the remaining banks except for the bank on which the refresh operation is performed, in the PE enable mode. In detail, the PE 120 may perform the data operation on memory cells connected to a wordline included in each of the banks on which the refresh operation is not performed, in the PE enable mode.

Figure 2:
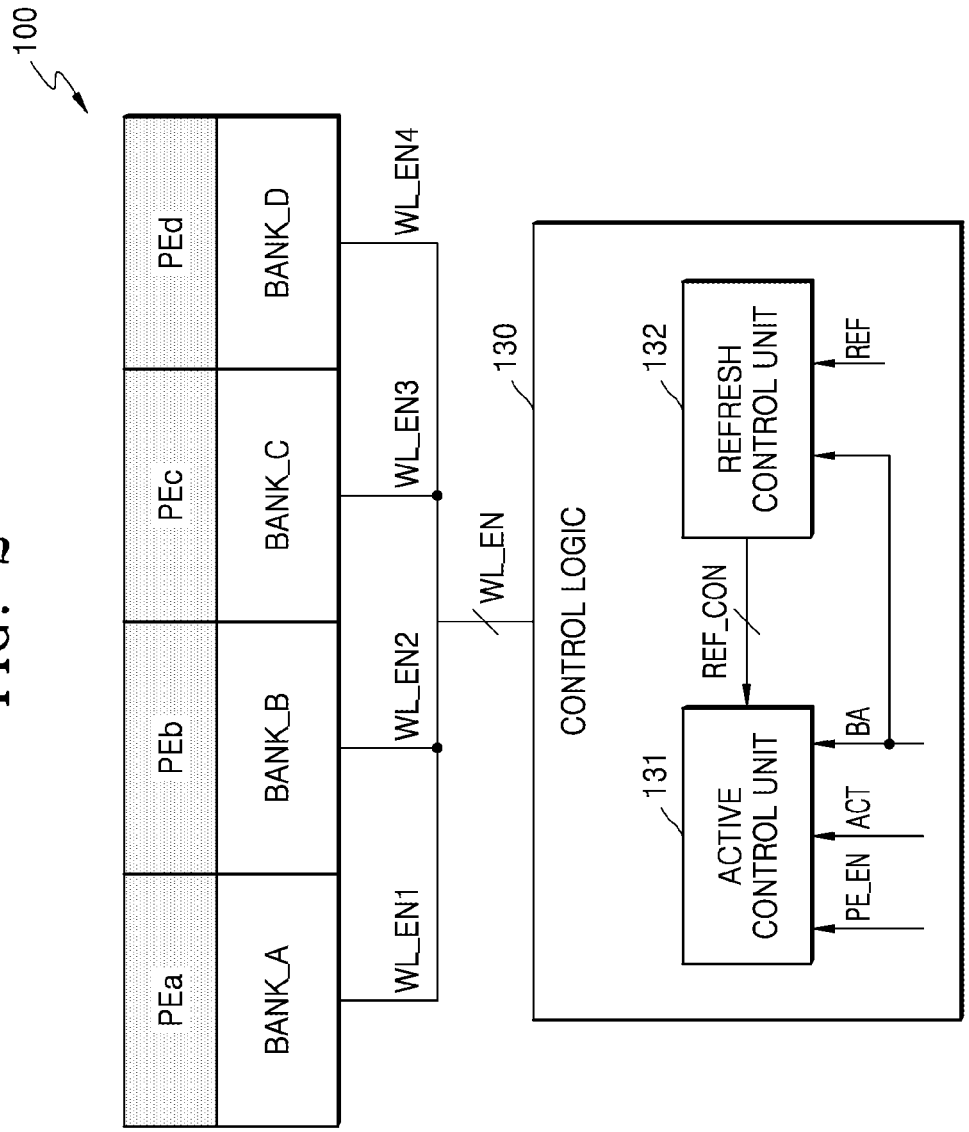
FIG. 2 is a block diagram illustrating a memory device according to some embodiments of the inventive concept.

FIG. 2 is a block diagram illustrating a memory device 100 according to some embodiments of the inventive concepts.

Referring to FIG. 2, the memory device 100 may include first through fourth banks BANK_A through BANK_D, first through fourth PEs PEa through PEd, and a control logic 130. The memory device 100 may correspond to the memory device 100 of FIG. 1. In some embodiments, the first through fourth PEs PEa through PEd may be respectively connected to the first through fourth banks BANK_A through BANK_D, and each of the first through fourth PEs PEa through PEd may perform operations on pieces of data respectively stored in the first through fourth banks BANK_A through BANK_D.

Figure 3:
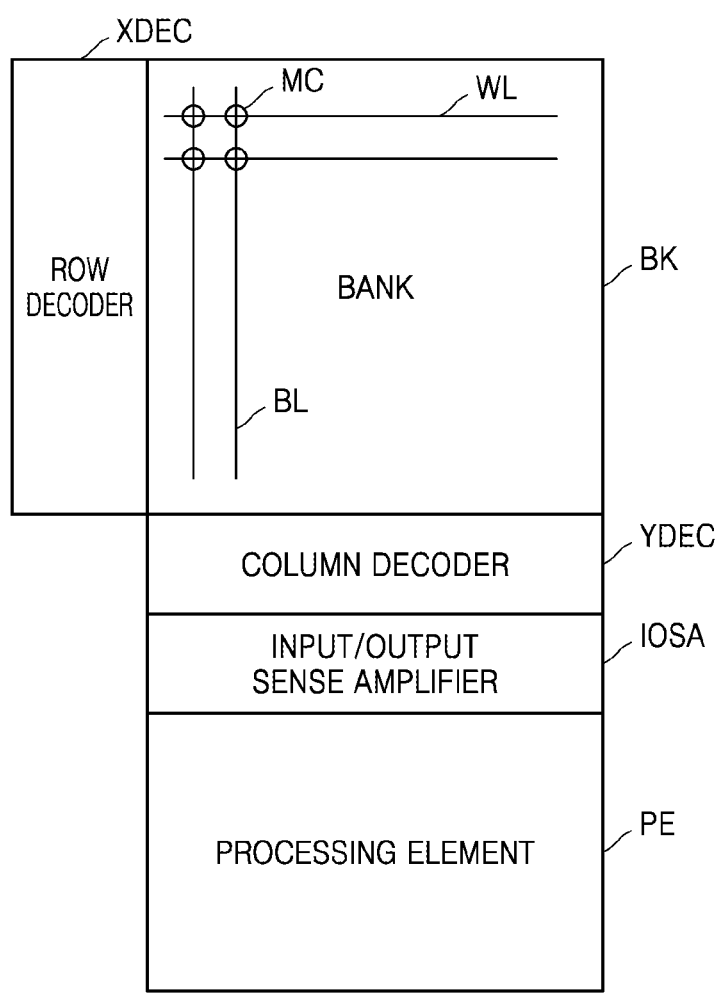
FIG. 3 is a block diagram illustrating a bank and a Processing Element (PE) according to some embodiments of the inventive concept.

FIG. 3 is a block diagram illustrating a bank BK and a PE, according to some embodiments of the inventive concepts.

Referring to FIG. 3, the bank BK may be connected to a row decoder XDEC and a column decoder YDEC. The bank BK may correspond to one of the first through fourth banks BANK_A through BANK_D of FIG. 2. In detail, the bank BK may include a plurality of wordlines WL connected to the row decoder XDEC, a plurality of bitlines BL connected to the column decoder YDEC, and a plurality of memory cells MC respectively arranged at intersections between the plurality of wordlines WL and the plurality of bitlines BL. An input/output sense amplifier IOSA may sense and amplify data read from the bank BK. According to some embodiments, positions of the column decoder YDEC and the input/output sense amplifier IOSA may be changed from that shown in FIG. 3. The PE may be connected to the input/output sense amplifier IOSA and may perform an operation on data received from the input/output sense amplifier IOSA. In some embodiments, the PE may be connected to the column decoder YDEC and may perform an operation on data received from the column decoder YDEC.

Referring to FIG. 2 again, the control logic 130 may generate wordline enable signals WL_EN for activating wordlines included in each of the first through fourth banks BANK_A through BANK_D based on a PE enable signal PE_EN. The wordline enable signals WL_EN may include first through fourth wordline enable signals WL_EN1 through WL_EN4 respectively corresponding to the first through fourth banks BANK_A through BANK_D. In detail, the control logic 130 may include an active control unit 131 and a refresh control unit 132. Hereinafter, detailed operations of the active control unit 131 and the refresh control unit 132 will be described.

The active control unit 131 may control an active operation in which wordlines included in each of the first through fourth banks BANK_A through BANK_D are activated, based on the PE enable signal PE_EN, an active command ACT, a bank address BA, and a refresh signal REF_CON. Hereinafter, operations of the active control unit 131 in a PE enable mode in which the PE enable signal PE_EN is activated and a PE disable mode in which the PE enable signal PE_EN is inactivated will be respectively described.

In the PE enable mode, the active control unit 131 may generate the wordline enable signals WL_EN to activate the wordlines included in each of the first through fourth banks BANK_A through BANK_D in response to the active command ACT. For example, the active control unit 131 may activate all of the first through fourth wordline enable signals WL_EN1 through WL_EN4 respectively applied to the first through fourth banks BANK_A and BANK_D.

Also, in the PE enable mode, the active control unit 131 may determine a bank from among the first through fourth banks BANK_A through BANK_D on which a refresh operation is performed, based on the refresh signal REF_CON. Here, the active control unit 131 may generate the wordline enable signals WL_EN so as not to activate a wordline included in the bank on which the refresh operation is performed, but to activate a wordline included in a bank on which the refresh operation is not performed, in response to the active command ACT. For example, if the refresh operation is to be performed on the second bank BANK_B, then the active control unit 131 may generate wordline enable signals WL_EN1, WL_EN2, and WL_EN4, so as to activate wordlines included in respective first, third, and fourth banks BANK_A, BANK_C, and BANK_D. Further, the active control 131 may refrain from generating a wordline enable signal WL_EN2, thereby preventing activation of wordlines included in the second bank BANK_B.

In the PE disable mode, the active control unit 131 may generate the wordline enable signals WL_EN to activate a wordline included in one of the first through fourth banks BANK_A through BANK_D in response to the active command ACT. For example, the active control unit 131 may select the first bank BANK_A from the first through fourth banks BANK_A through BANK_D based on the bank address BA, activate the first wordline enable signal WL_EN1 applied to the first bank BANK_A, and inactivate the second through fourth wordline enable signals WL_EN2 through WL_EN4 respectively applied to the second through fourth banks BANK_B through BANK_D.

The refresh control unit 132 may generate the refresh signal REF_CON to control the refresh operation on the first through fourth banks BANK_A through BANK_D, based on the bank address BA and a refresh command REF. For example, the refresh signal REF_CON may include first through fourth refresh signals respectively corresponding to the first through fourth banks BANK_A through BANK_D.

In some embodiments, the refresh operation may include a normal refresh operation that is performed in response to a refresh command and a refresh address received from the memory controller 200. For example, the refresh control unit 132 may generate the refresh signal REF_CON to sequentially perform the refresh operation on the first through fourth banks BANK_A through BANK_D according to the bank address BA, in response to the refresh command REF. In an embodiment, the refresh operation may include an auto refresh or self-refresh operation that internally generates a refresh address. For example, the refresh control unit 132 may generate the refresh signal REF_CON to sequentially perform the refresh operation on the first through fourth banks BANK_A through BANK_D according to the refresh address that is internally generated.

Figure 4:
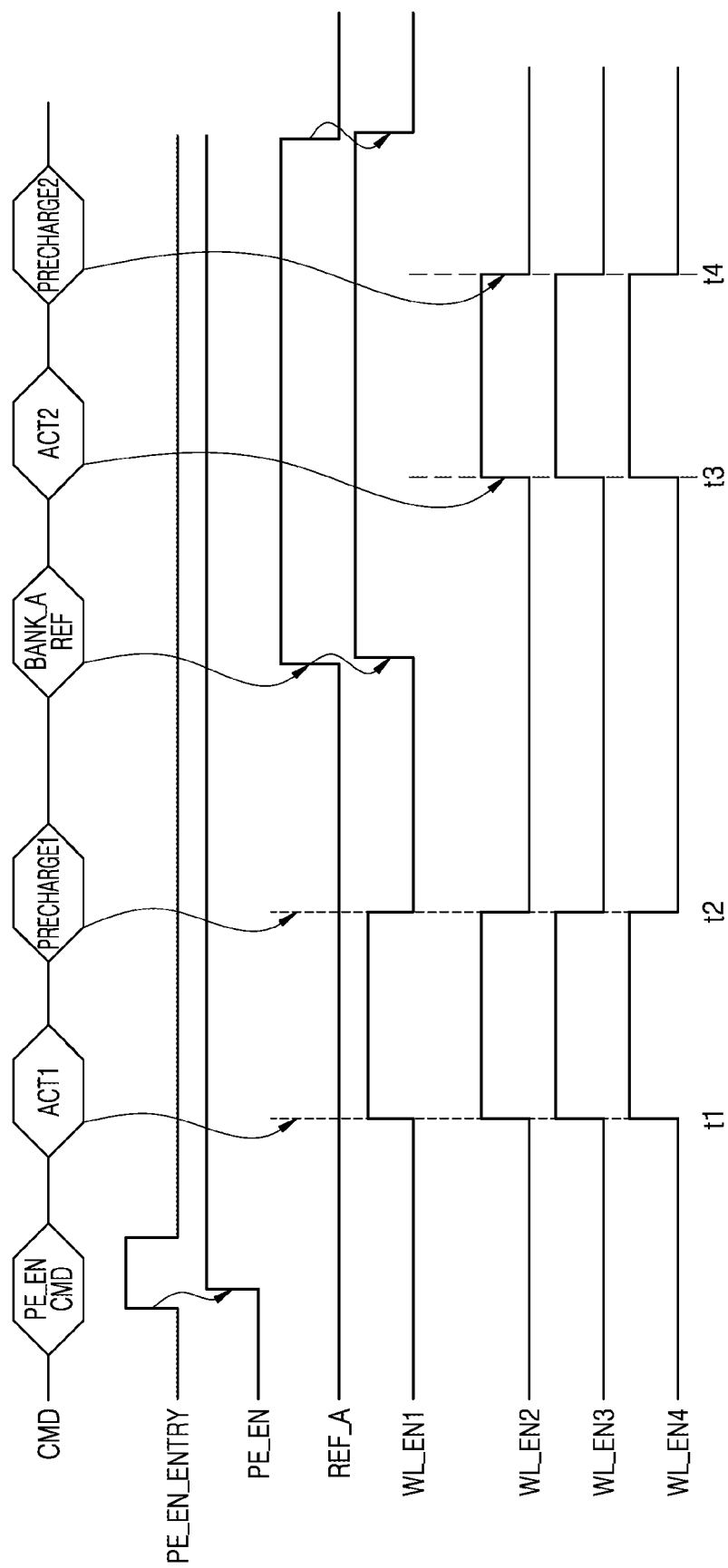
FIG. 4 is a timing diagram illustrating an operation of a memory device in a PE enable mode, according to some embodiments of the inventive concept.

FIG. 4 is a timing diagram illustrating an operation of the memory device 100 in a PE enable mode, according to an embodiment of the inventive concept.

Referring to FIGS. 1 through 4, the memory device 100 may receive a command CMD from the memory controller 200. For example, the memory device 100 may sequentially receive, from the memory controller 200, a PE enable command PE_EN CMD, a first active command ACT1, a first precharge command PRECHARGE1, a first bank refresh command BANK_A REF, a second active command ACT2, and a second precharge command PRECHARGE2.

In response to the PE enable command PE_EN CMD indicating PE enable, a PE enable entry signal PE_EN_ENTRY may be activated. When the PE enable entry signal PE_EN_ENTRY is activated, a PE enable signal PE_EN may transition from logic low to logic high. However, the present disclosure is not limited thereto, and the PE enable signal PE_EN may immediately transition from the logic low to the logic high in response to the PE enable command PE_EN CMD. In other words, in some embodiments, the PE enable entry signal PE_EN_ENTRY may be optional or omitted. Herein, a section in which the PE enable signal PE_EN is logic high may be defined as a "PE enable mode," and a section in which the PE enable signal PE_EN is logic low may be defined as a "PE disable mode" or a "normal mode."

In the PE enable mode, in response to the first active command ACT1, all of first through fourth wordline enable signals WL_EN1 through WL_EN4 may transition to logic high at a first time point t1. Therefore, wordlines included in each of the first through fourth banks BANK_A through BANK_D may be activated. Although not shown, the memory device 100 may receive a read command and/or a write command after receiving the first active command ACT1. The memory device 100 may perform a read operation on memory cells connected to an activated wordline in response to the read command, and the PE 120 may perform a data operation on read data. Also, the memory device 100 may write a result of the data operation or data received from the memory controller 200 to the activated wordline in response to the write command.

In response to the first precharge command PRECHARGE1, all of the first through fourth wordline enable signals WL_EN1 through WL_EN4 may transition to logic low at a second time point t2. Therefore, the wordlines included in each of the first through fourth banks BANK_A through BANK_D may be inactivated. Here, a section between the first time point t1 and the second time point t2 may be regarded as a section in which the first active command ACT1 is executed, and thus, may be defined as an "active section" or an "active operation section."

In response to the first bank refresh command BANK_A REF, a first refresh signal REF_A corresponding to the first bank BANK_A may transition to logic high. Therefore, the first wordline enable signal WL_EN1 corresponding to the first bank BANK_A may transition to logic high. The first refresh signal REF_A may maintain being logic high for a refresh period, and a section in which the first refresh signal REF_A is logic high may be defined as a "refresh section." When the first refresh signal REF_A transitions to logic low, the first wordline enable signal WL_EN1 corresponding to the first bank BANK_A may also transition to logic low.

In response to the second active command ACT2, the second through fourth wordline enable signals WL_EN2 through WL_EN4 may transition to logic high at a third time point t3. Therefore, wordlines included in each of the second through fourth banks BANK_B through BANK_D may be activated. Although not shown, the memory device 100 may receive a read command or a write command after receiving the second active command ACT2. Therefore, the memory device 100 may perform a read operation or a write operation on memory cells connected to an activated wordline and perform a data operation on the memory cells through the PE 120.

According to some embodiments, in the refresh section in which the first refresh signal REF_A is logic high, the active control unit 131 may interrupt an active operation on the first bank BANK_A on which the refresh operation is performed and may perform the active operation only on the second through fourth banks BANK_B through BANK_D on which the refresh operation is not performed. As described above, the active control unit 131 may selectively activate the wordlines included in each of the first through fourth banks BANK_A through BANK_D based on the refresh signal REF_CON.

In response to the second precharge command PRECHARGE2, all of the second through fourth wordline enable signals WL_EN2 through WL_EN4 may transition to logic low at a fourth time point t4. Therefore, wordlines included in each of the second through fourth banks BANK_B through BANK_D may be inactivated.

Figure 5:
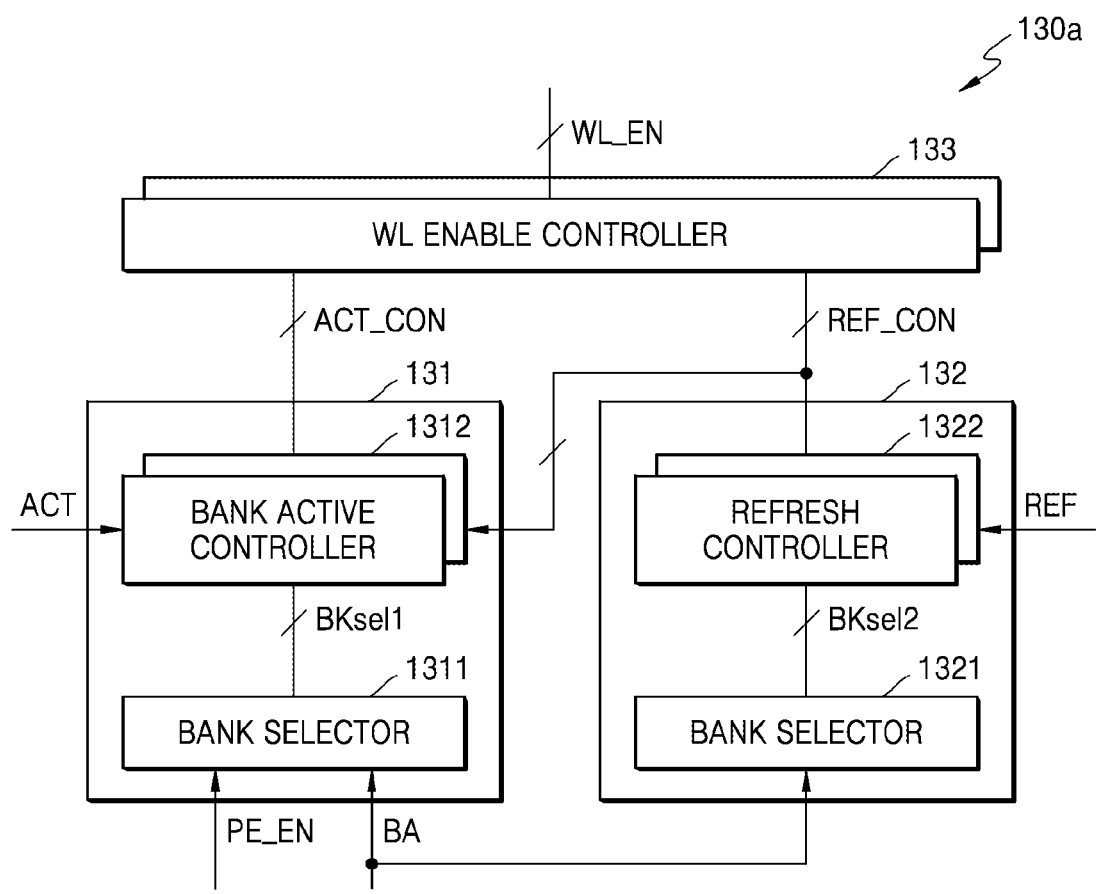
FIG. 5 is a block diagram illustrating in detail a control logic according to some embodiments of the inventive concept.

FIG. 5 is a block diagram illustrating in detail a control logic 130a according to some embodiments of the inventive concepts.

Referring to FIG. 5, the control logic 130a may include an active control unit 131, a refresh control unit 132, and wordline enable controllers 133. The active control unit 131 may include a bank selector 1311 and bank active controllers 1312. The refresh control unit 132 may include a bank selector 1321 and refresh controllers 1322. The control logic 130a may correspond to the example embodiment of the control logic 130 shown in FIG. 2. Hereinafter, the control logic 130a will be described with reference to FIGS. 2, 5 and 6.

The bank selector 1311 may generate a bank selection signal BKsel1 selecting at least one bank from a plurality of banks based on a PE enable signal PE_EN and a bank address BA. For example, when the PE enable signal PE_EN is activated, the bank selector 1311 may generate the bank selection signal BKsel1 to select all of the plurality of banks. When the PE enable signal PE_EN is inactivated or not activated, the bank selector 1311 may generate the bank selection signal BKsel1 to select one of the plurality of banks according to the bank address BA. Hereinafter, a bank selection operation will be described with reference to FIG. 6.

FIG. 6 illustrates a bank selection table TA1 according to some embodiments of the inventive concepts.

Referring to FIG. 6, a bank address BA may be a 2-bit signal including BA0 and BA1. For example, the bank address BA may be generated by decoding the address ADDR received from the memory controller 200. For example, in a PE disable mode, the bank selector 1311 may select a first bank BANK_A when the bank address BA is "00," select a second bank BANK_B when the bank address BA is "01," select a third bank BANK_C when the bank address BA is "10," and select a fourth bank BANK_D when the bank address BA is "11." In a PE enable mode, the bank selector 1311 may select all of the first through fourth banks BANK_A through BANK_D.

Referring to FIG. 5 again, the bank active controllers 1312 may respectively correspond to a plurality of banks. For example, when the plurality of banks includes first through fourth banks (e.g., BANK_A through BANK_D of FIG. 2), the bank active controllers 1312 may include four bank active controllers respectively corresponding to the first through fourth banks. The bank active controllers 1312 may generate an active control signal ACT_CON based on an active command ACT and the bank selection signal BKsel1. In detail, the bank active controllers 1312 may generate the active control signal ACT_CON to activate a wordline included in at least one bank selected according to the bank selection signal BKsel1, in response to the active command ACT.

The bank selector 1321 may generate a bank selection signal BKsel2 selecting at least one from a plurality of banks based on the bank address BA. The refresh controllers 1322 may respectively correspond to a plurality of banks. For example, when the plurality of banks includes first through fourth banks (e.g., BANK_A through BANK_D of FIG. 2), the refresh controllers 1322 may include four refresh controllers respectively corresponding to the first through fourth banks. The refresh controllers 1322 may generate a refresh signal REF_CON based on a refresh command REF and the bank selection signal BKsel2. In detail, the refresh controllers 1322 may generate the refresh signal REF_CON to perform a refresh operation on at least one bank selected according to the bank selection signal BKsel2, in response to the refresh command REF.

The wordline enable controllers 133 may respectively correspond to a plurality of banks. For example, when the plurality of banks include first through fourth banks (e.g., BANK_A through BANK_D of FIG. 2), the wordline enable controllers 133 may include four wordline enable controllers respectively corresponding to the first through fourth banks. The wordline enable controllers 133 may generate wordline enable signals WL_EN based on an active control signal ACT_CON and the refresh signal REF_CON.

Figure 7:
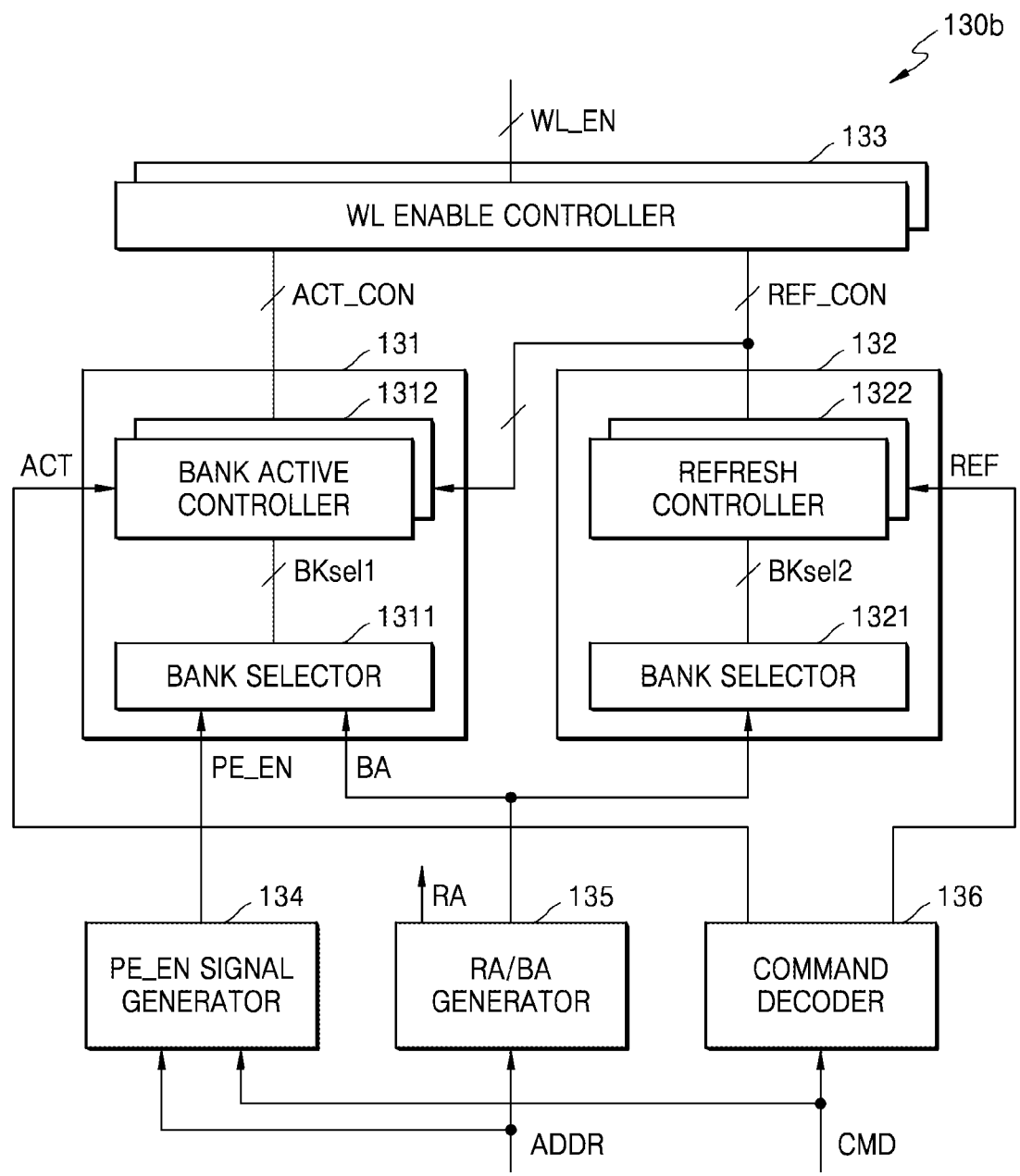
FIG. 7 is a block diagram illustrating in detail a control logic according to some embodiments of the inventive concepts.

FIG. 7 is a block diagram illustrating in detail a control logic 130b according to some embodiments of the inventive concepts.

Referring to FIG. 7, as compared to the control logic 130a of FIG. 5, the control logic 130b may further include a PE enable signal generator 134, a row address (RA)/bank address (BA) generator 135, and a command decoder 136. The PE enable signal generator 134 may generate a PE enable signal PE_EN based on a command CMD and an address ADDR. In some embodiments, the PE enable signal generator 134 may receive a row address RA from the RA/BA generator 135 and may also generate the PE enable signal PE_EN based on the command CMD and the row address RA.

The RA/BA generator 135 may receive the address ADDR from the memory controller 200 and may generate the row address RA and a bank address BA from the received address ADDR. The generated bank address BA may be provided to a bank selector 1311 included in an active control unit 131 and a bank selector 1321 included in a refresh control unit 132. The generated row address RA may be provided to a row decoder (e.g., the row decoder XDEC of FIG. 3) connected to each bank.

The command decoder 136 may receive the command CMD from the memory controller 200 and may generate an active command ACT and a refresh command REF by decoding the received command CMD. The generated active command ACT may be provided to bank active controllers 1312 included in the active control unit 131, and the generated refresh command REF may be provided to refresh controllers 1322 included in the refresh control unit 132.

Figure 8:
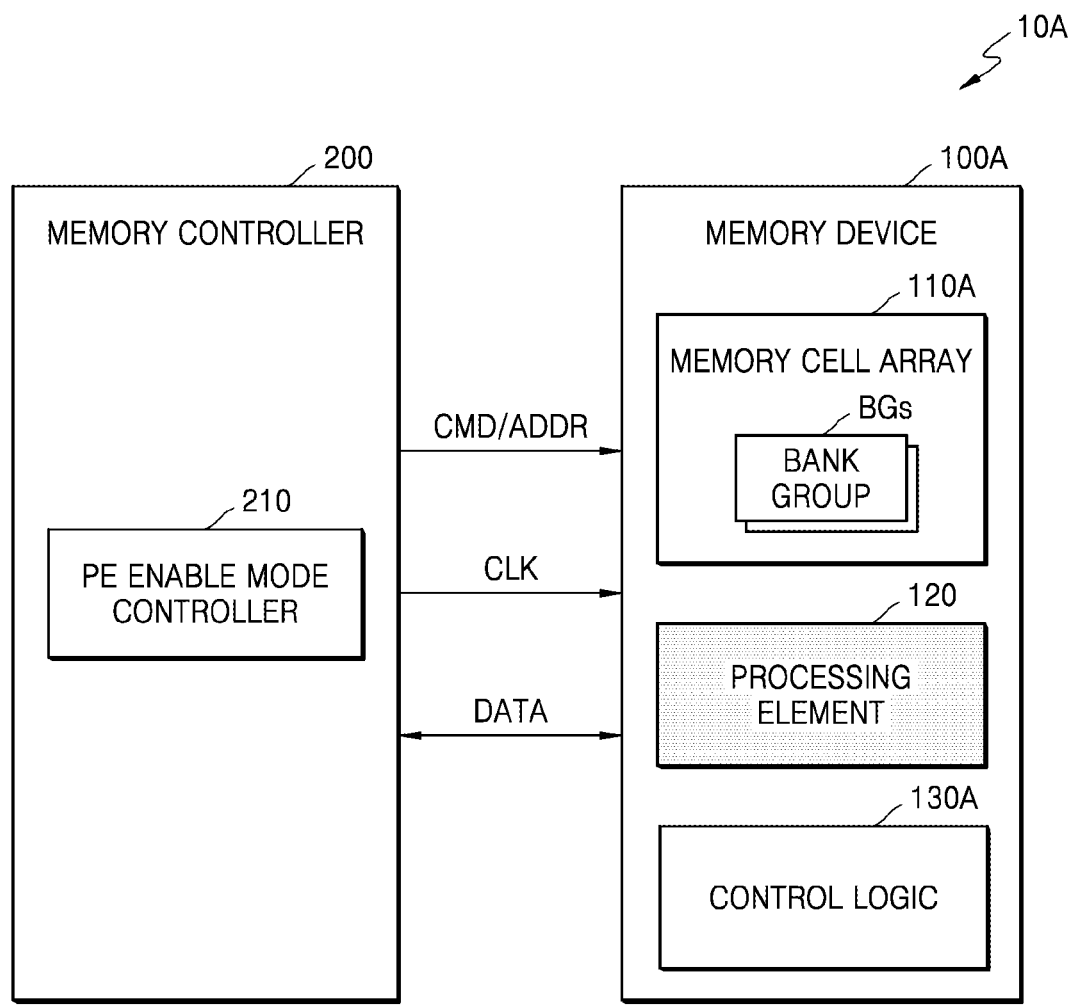
FIG. 8 is a block diagram illustrating a memory system according to some embodiments of the inventive concepts.

FIG. 8 is a block diagram illustrating a memory system 10A according to some embodiments of the inventive concepts.

Referring to FIG. 8, the memory system 10A may include a memory device 100A and a memory controller 200, and the memory device 100A may include a memory cell array 110A, a PE 120, and a control logic 130A. The memory cell array 110A may include a plurality of bank groups BGs. The memory system 10A may correspond generally to the memory system 10 of FIG. 1, except that in some embodiments, the memory cell array 110A may include the plurality of bank groups BGs unlike the memory cell array 110 of FIG. 1, and each of the plurality of bank groups BGs may include a plurality of banks.

Figure 9:
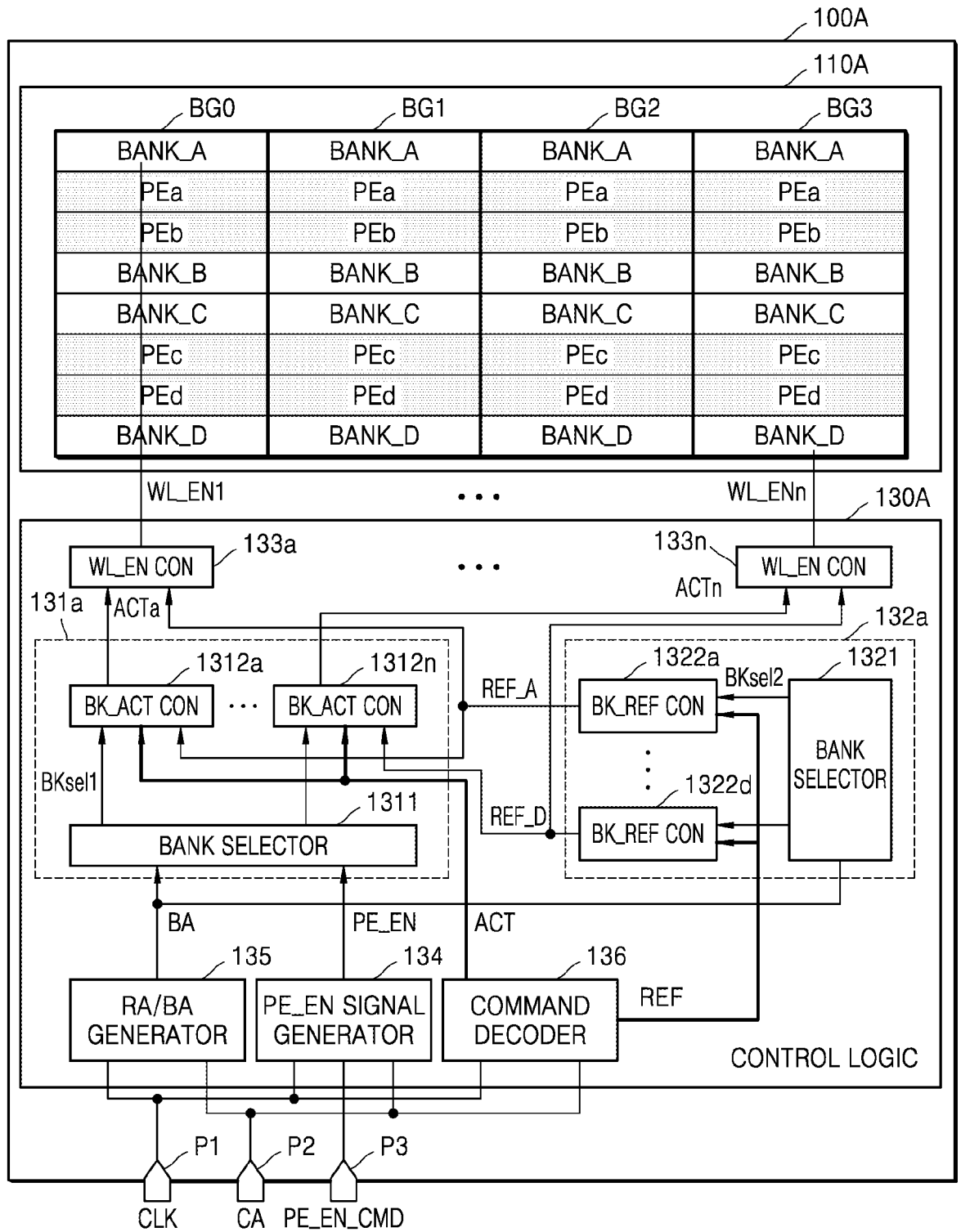
FIG. 9 is a block diagram illustrating a memory device according to some embodiments of the inventive concepts.

FIG. 9 is a block diagram illustrating the memory device 100A, according to some embodiments of the inventive concepts.

Referring to FIG. 9, the memory cell array 110A may include first through fourth bank groups BG0 through BG3, and each of the first through fourth bank groups BG0 through BG3 may include first through fourth banks BANK_A through BANK_D. The first through fourth banks BANK_A through BANK_D of each bank group may be respectively connected to first through fourth PEs PEa through PEd, and thus, the first through fourth PEs PEa through PEd are illustrated as being included in the memory cell array 110A. However, the inventive concepts are not limited thereto, and the number of bank groups included in the memory cell array 110A and the number of banks included in each bank group may be variously selected in different embodiments.

In some embodiments, the memory device 100A may include a clock pin P1 receiving a clock signal CLK and a plurality of command/address (CA) pins P2 receiving a command CMD and an address ADDR. Here, a PE enable signal generator 134 may generate a PE enable signal PE_EN from the clock signal CLK received through the clock pin P1, and the command CMD and the address ADDR received through the plurality of CA pins P2. In some embodiments, the memory device 100A may further include a PE pin P3 receiving a PE enable command PE_EN_CMD. Here, the PE enable signal generator 134 may generate the PE enable signal PE_EN from the PE enable command PE_EN_CMD received through the PE pin P3.

A control logic 130A may include an active control unit 131a, a refresh control unit 132a, wordline enable controllers 133a through 133n, the PE enable signal generator 134, an RA/BA generator 135, and a command decoder 136. The command decoder 136 may generate an active command ACT and a refresh command REF from the clock signal CLK received through the clock pin P1, and the command CMD and the address ADDR received through the plurality of CA pins P2. The RA/BA generator 135 may generate a row address RA and a bank address BA from the clock signal CLK received through the clock pin P1, and the command CMD and the address ADDR received through the plurality of CA pins P2.

The active control unit 131a may include a bank selector 1311 and bank active controllers 1312a through 1312n, and the number of bank active controllers 1312a through 1312n may be equal to or correspond to the number of banks included in the memory cell array 110A. For example, the number of banks included in the memory cell array 110A may be 16, and the number of bank active controllers 1312a through 1312n may be 16. The bank active controllers 1312a through 1312n may respectively correspond to banks included in the memory cell array 110A.

For example, when a bank selection signal BKsel1 and the active command ACT are activated and a first refresh signal REF_A is inactivated, the bank active controller 1312a may generate a first bank active signal ACTa that is activated. When all of the bank selection signal BKsel1, the active command ACT, and the first refresh signal REF_A are activated, the bank active controller 1312a may generate the first bank active signal ACTa that is inactivated. For example, the bank active controller 1312a may generate an inverted first refresh signal by performing an inverting operation on the first refresh signal REF_A and may generate the first bank active signal ACTa by performing an AND operation on the bank selection signal BKsel1, the active command ACT, and the inverted first refresh signal. The first bank active signal ACTa may be provided for the wordline enable controller 133a.

The refresh control unit 132a may include a bank selector 1321 and refresh controllers 1322a through 1322d, and the number of refresh controllers 1322a through 1322d may correspond to the number of banks BANK_A through BANK_D included in each bank group of the memory cell array 110A. For example, the number of banks included in each bank group may be 4, and the number of refresh controllers 1322a through 1322d may be 4.

For example, when a bank selection signal BKsel2 and the refresh command REF are activated, the refresh controller 1322a may generate the first refresh signal REF_A that is activated. When at least one selected from the bank selection signal BKsel2 and the refresh command REF is inactivated, the refresh controller 1322a may generate the first refresh signal REF_A that is inactivated. For example, the refresh controller 1322a may generate the first refresh signal REF_A by performing an AND operation on the bank selection signal BKsel2 and the refresh command REF. The first refresh signal REF_A may be provided for the bank active controller 1312a and the wordline enable controller 133a.

The number of wordline enable controllers 133a through 133n may correspond to the number of banks included in the memory cell array 110A. For example, the number of banks included in the memory cell array 110A may be 16, and the number of wordline enable controllers 133a through 133n may be 16.

For example, when at least one selected from the first bank active signal ACTa and the first refresh signal REF_A is activated, the wordline enable controller 133a may generate a first wordline enable signal WL_EN1 that is activated. When both the first bank active signal ACTa and the first refresh signal REF_A are inactivated, the wordline enable controller 133a may generate the first wordline enable signal WL_EN1 that is inactivated. For example, the wordline enable controller 133a may generate the first wordline enable signal WL_EN1 by performing an OR operation on the first bank active signal ACTa and the first refresh signal REF_A.

Figure 10:
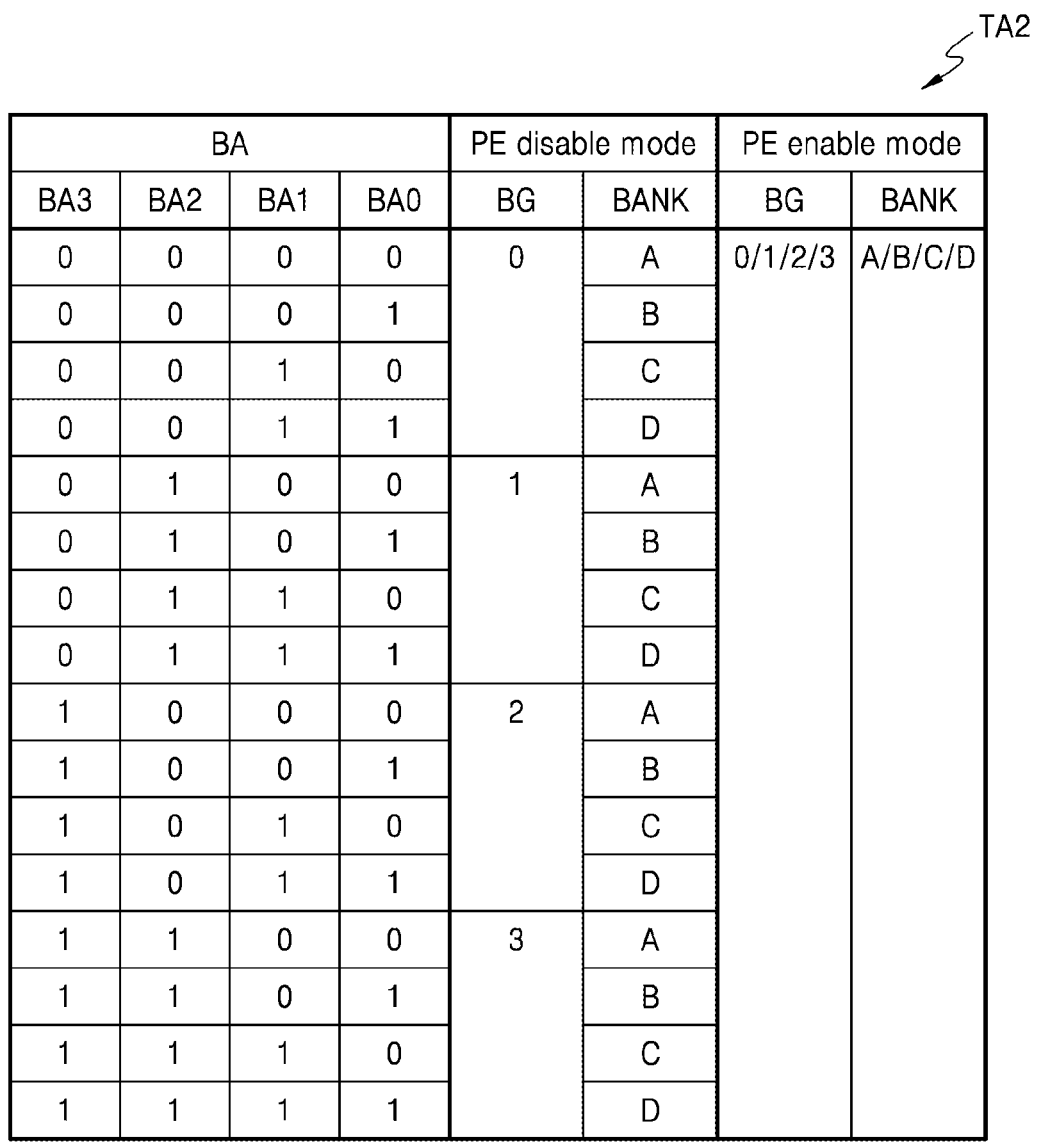
FIG. 10 illustrates a bank selection table according to some embodiments of the inventive concepts.

FIG. 10 illustrates a bank selection table TA2 according to some embodiments of the inventive concepts.

Referring to FIG. 10, the RA/BA generator 135 may generate a bank address BA that is a 4-bit signal including BA0 through BA3, by decoding the address ADDR. In a PE disable mode, the bank selector 1311 may select a first bank BANK_A of a first bank group BG0 when the bank address BA is "0000," select a second bank BANK_B of the first bank group BG0 when the bank address BA is "0001," select a third bank BANK_C of the first bank group BG0 when the bank address BA is "0010," and select a fourth bank BANK_D of the first bank group BG0 when the bank address BA is "0011." The banks of other bank groups may be selected when the bank address BA is as shown in FIG. 10. As described above, in the PE disable mode, the bank selector 1311 may sequentially select one bank according to the bank address BA. In a PE enable mode, the bank selector 1311 may select all of the first through fourth banks BANK_A through BANK_D of first through fourth bank groups BG0 through BG3.

Figure 11:
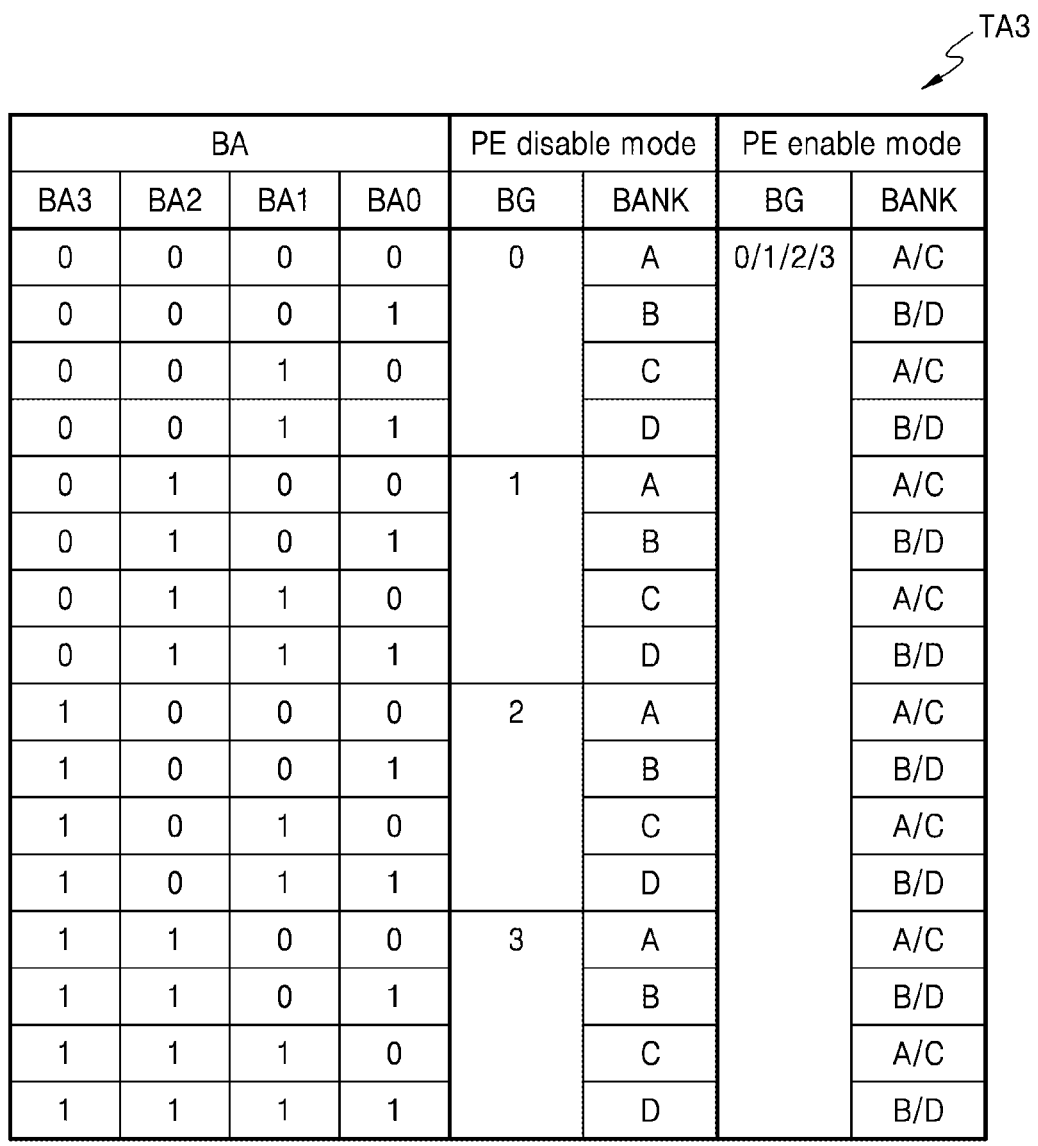
FIG. 11 illustrates a bank selection table according to some embodiments of the inventive concepts.

FIG. 11 illustrates a bank selection table TA3 according to some embodiments of the inventive concepts.

Referring to FIG. 11, the RA/BA generator 135 may generate a bank address BA that is a 4-bit signal including BA0 through BA3 by decoding the address ADDR. In a PE disable mode, the bank selector 1311 may sequentially select one bank according to the bank address BA in the same manner as illustrated in FIG. 10.

In a PE enable mode, the bank selector 1311 may mask upper three bits, i.e., BA3, BA2, and BA1, and select two banks of each bank group according to the least significant bit, i.e., BA0. For example, in the PE enable mode, the bank selector 1311 may select first and third banks BANK_A and BANK_C when the bank address BA is "0000" and select second and fourth banks BANK_B and BANK_D when the bank address BA is "0001." However, the inventive concepts are not limited thereto, and a plurality of banks may be selectively activated by masking one or more bits of the bank address BA according to the number of bank groups and/or banks included in a memory cell array.

Figure 12:
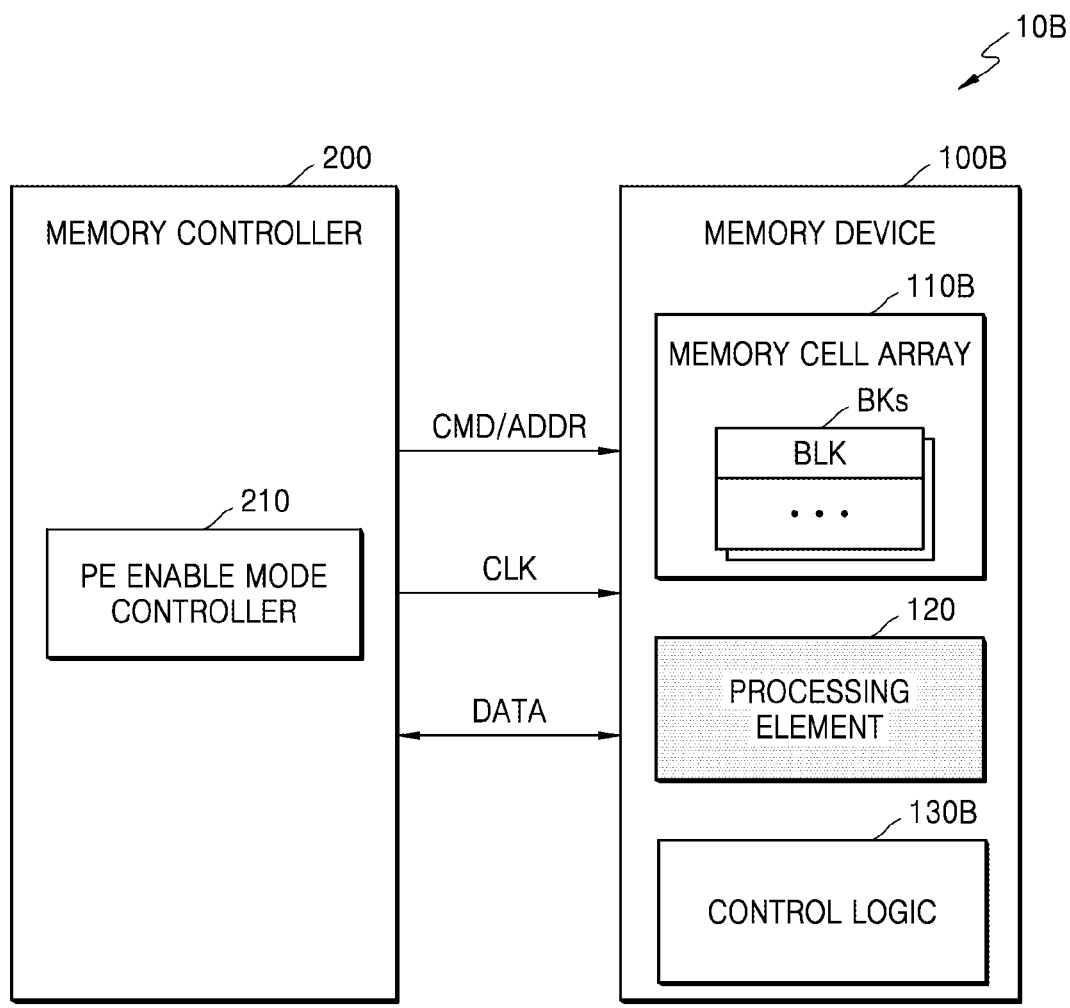
FIG. 12 is a block diagram illustrating a memory system according to some embodiments of the inventive concepts.

FIG. 12 is a block diagram illustrating a memory system 10B according to some embodiments of the inventive concepts.

Referring to FIG. 12, the memory system 10B may include a memory device 100B and a memory controller 200, and the memory device 100B may include a memory cell array 110B, a PE 120, and a control logic 130B. The memory cell array 110B may include a plurality of banks BKs, and each of the plurality of banks BKs may include a plurality of blocks BLK. The memory system 10B may correspond generally to the memory system 10 of FIG. 1, except with each of the plurality of banks BK including a plurality of blocks BLK. Hereinafter, dispositions of each bank BK and a PE will be described with reference to FIG. 13.

Figure 13:
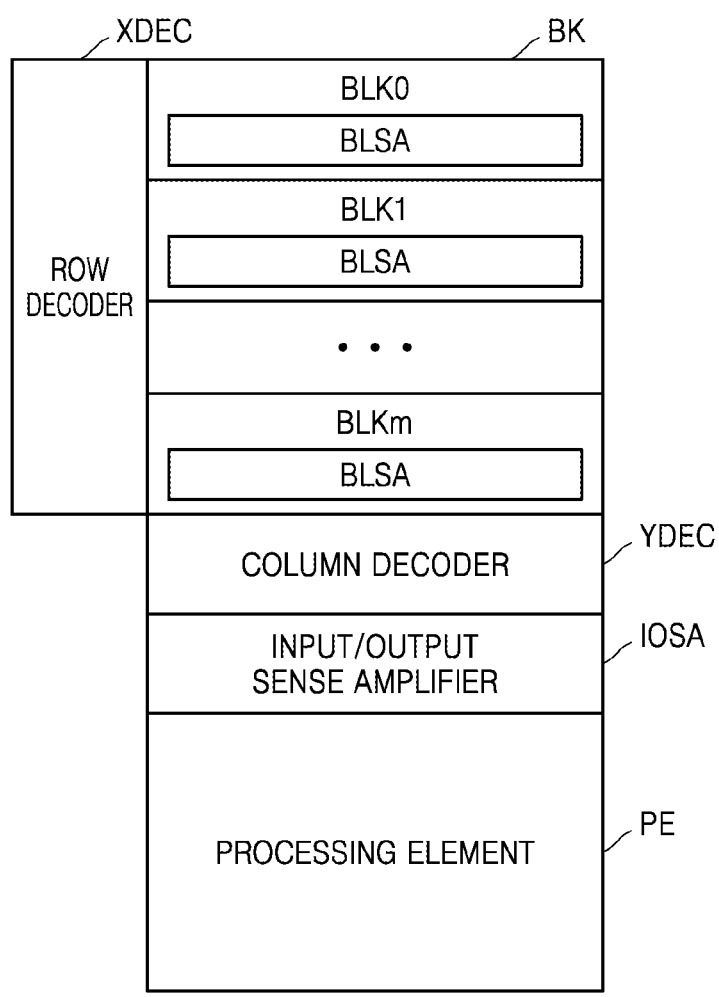
FIG. 13 is a block diagram illustrating a bank and a PE according to some embodiments of the inventive concepts.

FIG. 13 is a block diagram illustrating a bank BK and a PE according to some embodiments of the inventive concepts.

Referring to FIG. 13, the bank BK may be connected to a row decoder XDEC and a column decoder YDEC. The bank BK may correspond to one of the plurality of banks BKs of FIG. 12. In detail, the bank BK may include a plurality of blocks BLK0 through BLKm (wherein m is a natural number). The plurality of blocks BLK0 through BLKm may be respectively connected to a plurality of bitline sense amplifiers BLSA. An input/output sense amplifier IOSA may sense and amplify data read from the bank BK. According to some embodiments, positions of the column decoder YDEC and the input/output sense amplifier IOSA may be changed. The PE may be connected to the input/output sense amplifier IOSA and may perform an operation on data received from the input/output sense amplifier IOSA.

Figure 14:
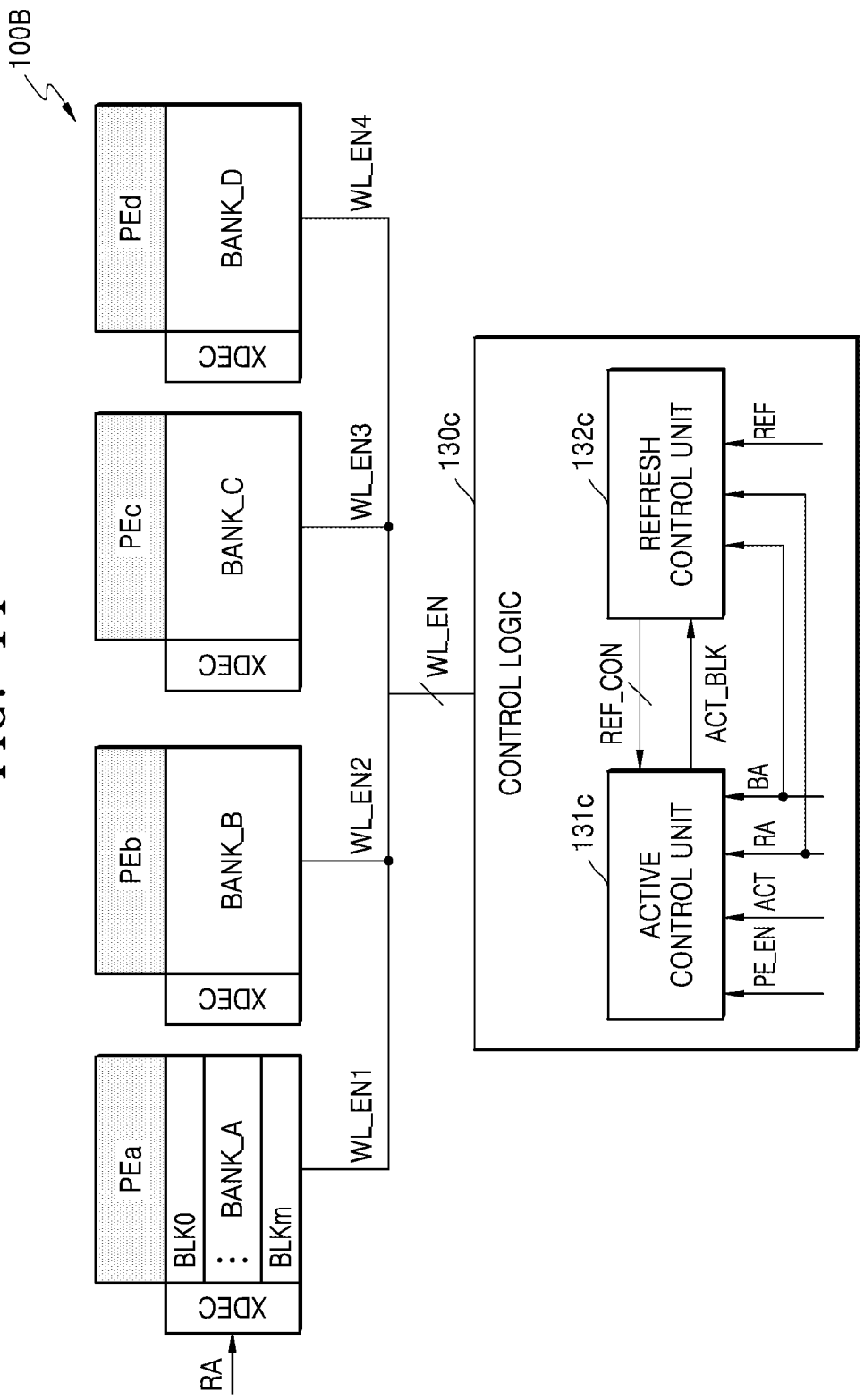
FIG. 14 is a block diagram illustrating a memory device according to some embodiments of the inventive concepts.

FIG. 14 is a block diagram illustrating a memory device 100B according to some embodiments of the inventive concepts.

Referring to FIG. 14, the memory device 100B may include first through fourth banks BANK_A through BANK_D, first through fourth PEs PEa through PEd, and a control logic 130c. The memory device 100B may correspond to the memory device 100B of FIG. 12. In some embodiments, the first through fourth PEs PEa through PEd may be respectively connected to the first through fourth banks BANK_A through BANK_D and may respectively perform operations on pieces of data respectively stored in the first through fourth banks BANK_A through BANK_D.

The control logic 130c may include an active control unit 131c and a refresh control unit 132c. The active control unit 131c may determine a block in an active state in each bank based on a row address RA and may provide the refresh control unit 132c with active block information ACT_BLK so that a refresh operation is not performed on the block in the active state. The refresh control unit 132c may generate a refresh signal REF_CON based on the active block information ACT_BLK so that the refresh operation is not performed on the block in the active state.

Also, the active control unit 131c may determine a block on which the refresh operation is being performed based on the row address RA and the refresh signal REF_CON in response to an active command ACT in a PE enable mode, and generate wordline enable signals WL_EN not to activate a wordline included in the block on which the refresh operation is being performed, and to activate a wordline included in a block on which the refresh operation is not performed.

Figure 15:
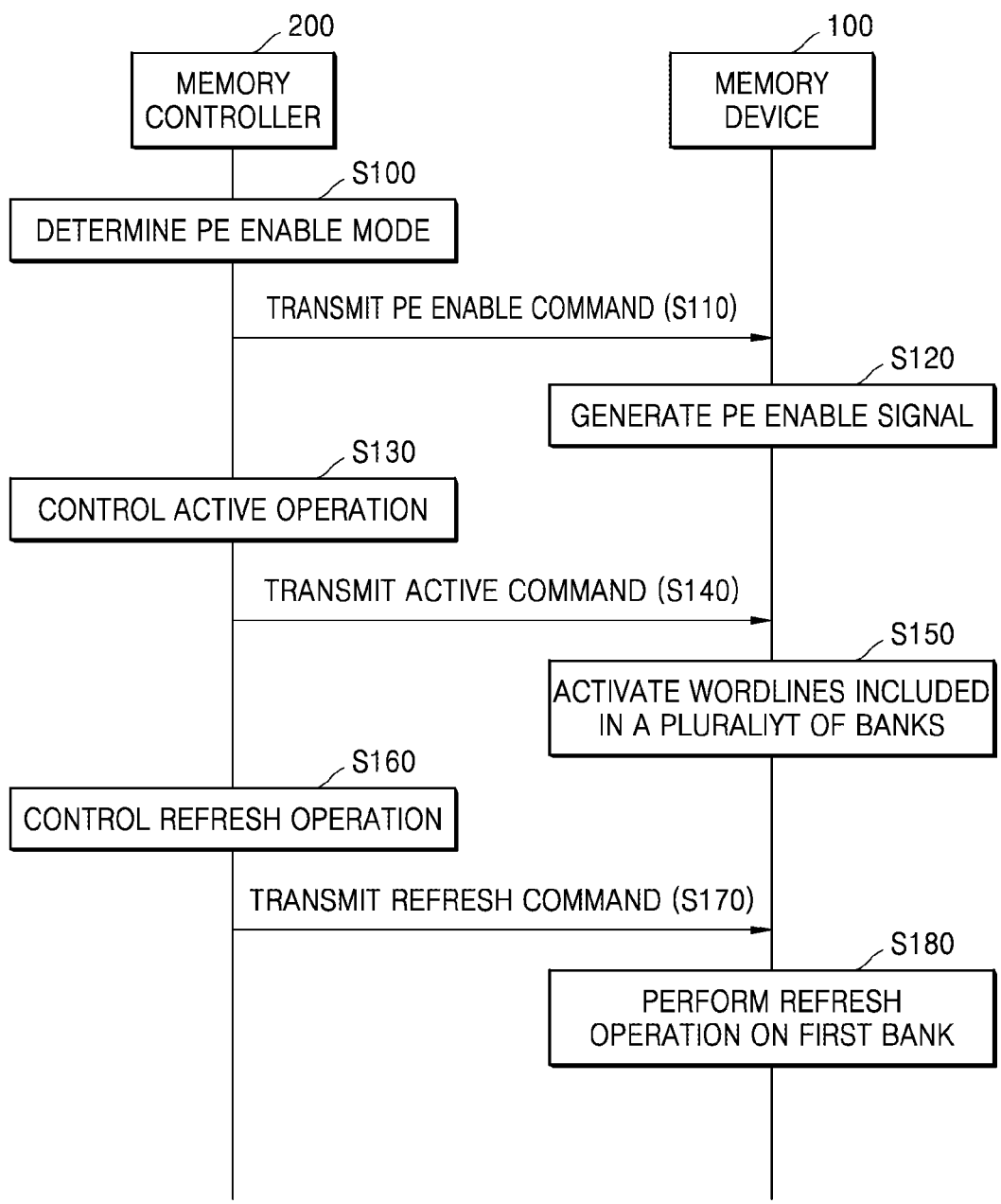
FIG. 15 is a flowchart illustrating operations between a memory device and a memory controller, according to some embodiments of the inventive concepts.

FIG. 15 is a flowchart illustrating operations between a memory device 100 and a memory controller 200, according to some embodiments of the inventive concepts.

Referring to FIG. 15, an operating method according to some embodiments relates to a method of controlling an active operation and a refresh operation in the memory device 100 that includes a PE, for example, and may include operations that are performed in a time series in the memory device 100 and the memory controller 200 of FIG. 1. The above descriptions with reference to FIGS. 1 through 14 may also be applied to the operations shown in FIG. 15. The operating method will now be described with reference to FIGS. 1 and 15.

In operation S100, the memory controller 200 determines a PE enable mode. For example, the PE enable mode controller 210 may determine the PE enable mode to enable an operation of the PE 120. In operation S110, the memory controller 200 transmits a PE enable command to the memory device 100. For example, the PE enable command may be generated by a combination of the command CMD, the address ADDR, and the clock signal CLK. In operation S120, the memory device 100 generates a PE enable signal in response to the PE enable command.

In operation S130, the memory controller 200 controls an active operation of the memory device 100. In operation S140, the memory controller 200 transmits an active command to the memory device 100. In operation S150, the memory device 100 activates wordlines included in each of a plurality of banks BKs in response to the active command. As described above, in the PE enable mode in which the PE enable signal is activated, since the memory device 100 activates as many wordlines as possible, as many PEs 120 as possible may simultaneously perform computational operations, thereby improving performances of the memory device 100 and the memory system 10.

In operation S160, the memory controller 200 controls a refresh operation of the memory device 100. In operation S170, the memory controller 200 transmits a refresh command to the memory device 100. In operation S180, the memory device 100 performs the refresh operation on a first bank. In detail, the control logic 130 may enable a wordline included in the first bank and may perform the refresh operation on memory cells connected to the enabled wordline.

Figure 16:
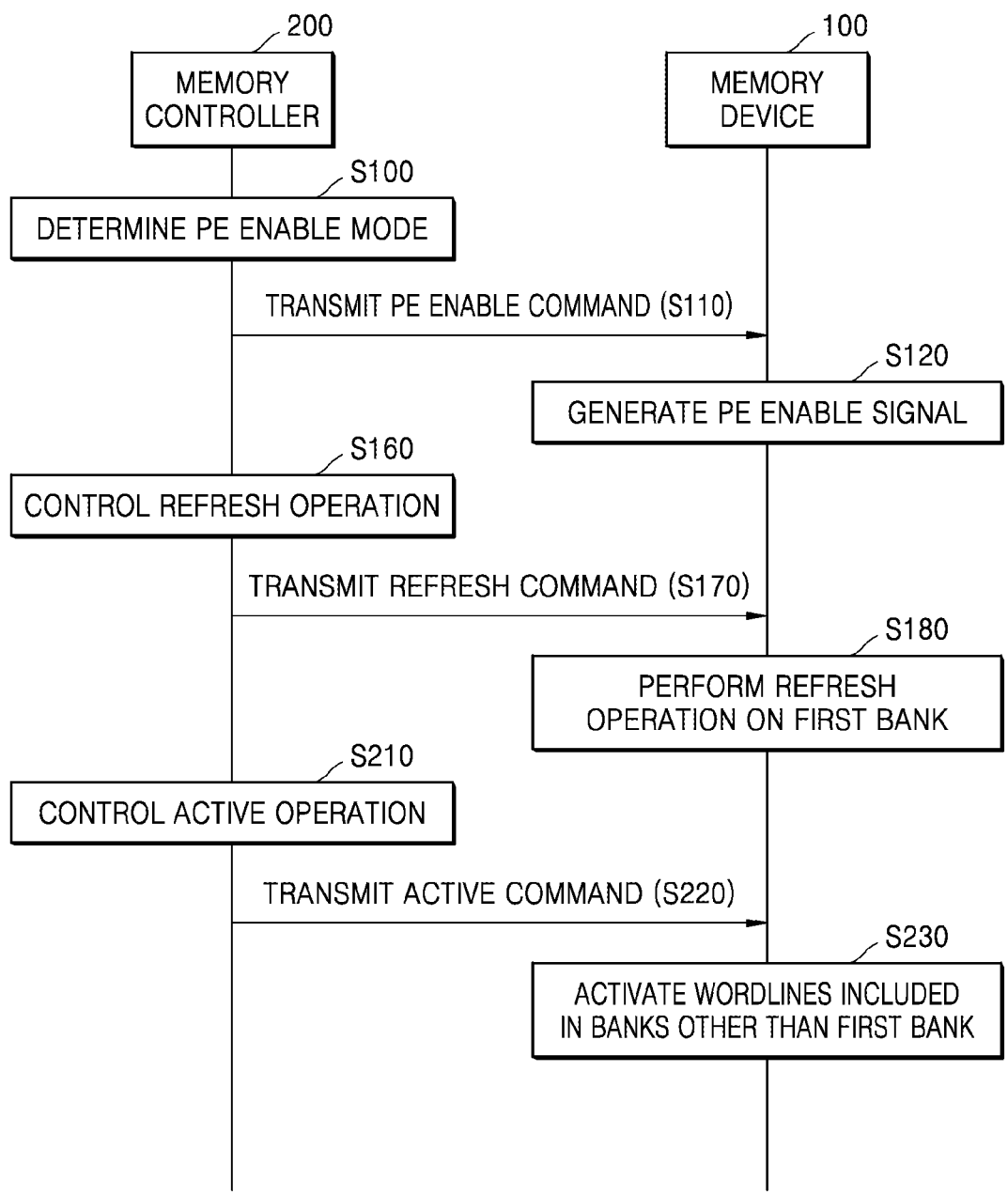
FIG. 16 is a flowchart illustrating operations between a memory device and a memory controller, according to some embodiments of the inventive concepts.

FIG. 16 is a flowchart illustrating operations between a memory device 100 and a memory controller 200, according to some embodiments of the inventive concepts.

Referring to FIG. 16, an operating method according to some embodiments relates to a method of controlling an active operation and a refresh operation in the memory device 100 including a PE, for example, and may include operations that are performed in a time series in the memory device 100 and the memory controller 200 of FIG. 1. The operations S100, S110, S120, S160, S170, and S180 described above with reference to FIG. 15 may be respectively applied to operations S100, S110, S120, S160, S170, and S180 of FIG. 16, and duplicate descriptions thereof are omitted herein.

In operation S210, the memory controller 200 controls an active operation of the memory device 100. In operation S220, the memory controller 200 transmits an active command to the memory device 100. In operation S230, the memory device 100 activates wordlines included in banks other than a first bank among a plurality of banks BKs in response to the active command. As described above, in the PE enable mode in which the PE enable signal is activated, since the memory device 100 activates as many wordlines as possible included in banks except for a bank on which the refresh operation is being performed, as many PEs 120 as possible may simultaneously perform computational operations, thereby improving performances of the memory device 100 and the memory system 10.

Figure 17:
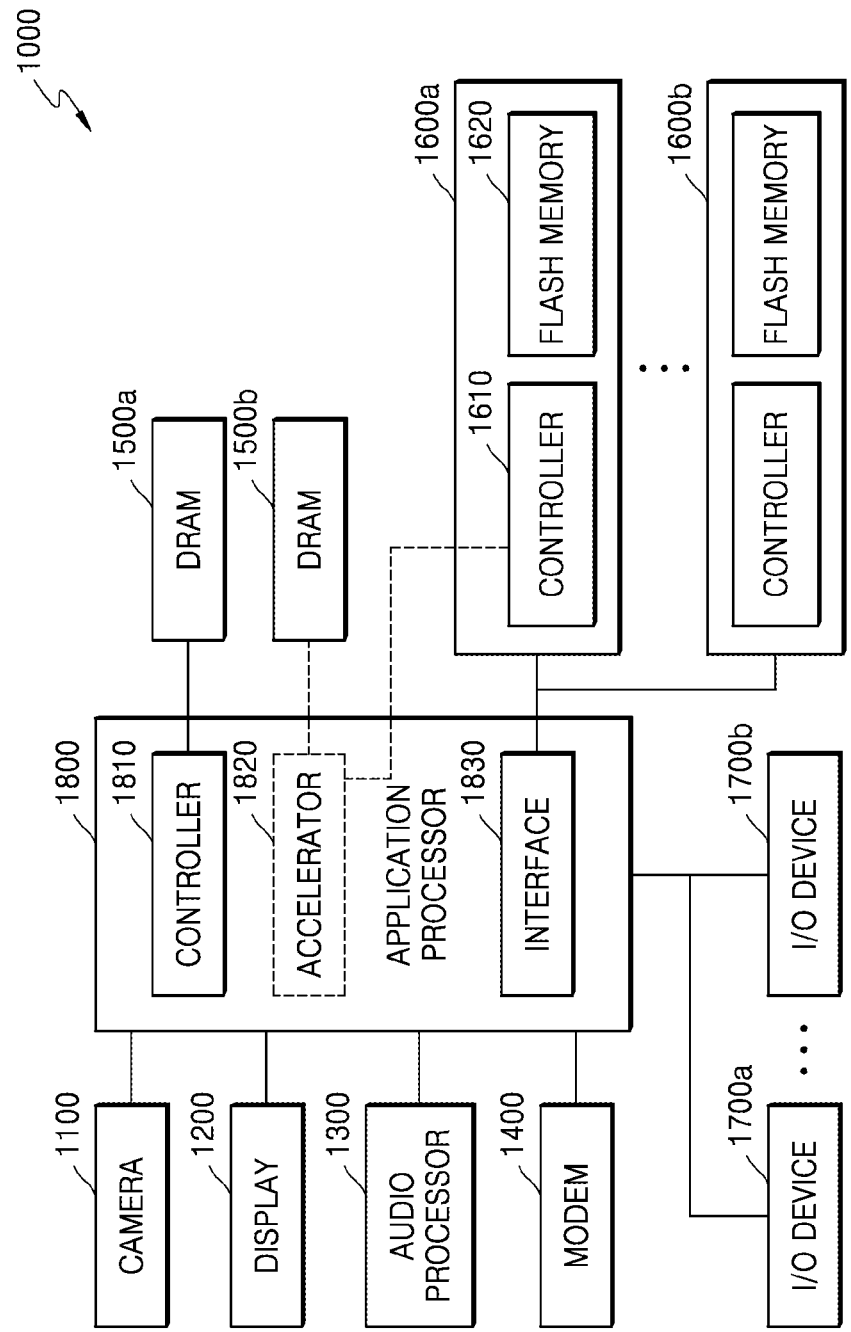
FIG. 17 is a block diagram illustrating a mobile system to which a memory device is applied, according to some embodiments of the inventive concepts.

FIG. 17 is a block diagram illustrating a mobile system 1000 to which a memory device is applied, according to an embodiment of the inventive concept.

Referring to FIG. 17, the mobile system 1000 may include a camera 1100, a display 1200, an audio processor 1300, a modem 1400, dynamic random access memories (DRAMs) 1500a and 1500b, flash memory devices 1600a and 1600b, input/output (I/O) devices 1700a and 1700b, and an application processor (AP) 1800. The mobile system 1000 may be implemented as a laptop computer, a mobile phone, a smartphone, a tablet personal computer (PC), a wearable device, a healthcare device, or an Internet of Things (IoT) device. Also, the mobile system 1000 may be embodied as a server or a personal computer (PC).

The camera 1100 may capture a still image or a moving image under control of a user. The camera 1100 may be embodied as a plurality of cameras including a front camera, a rear camera, and the like. The display 1200 may be embodied in various forms such as a Liquid Crystal Display (LCD), an Organic Light Emitting Diode (OLED) display, an Active-Matrix Organic Light Emitting Diode (AM-OLED) display, a Plasma Display Panel (PDP), and the like. The audio processor 1300 may process audio data included in contents stored in the flash memory devices 1600a and 1600b. For example, the audio processor 1300 may perform various types of processing, such as decoding, amplifying, noise filtering, and the like, on audio data.

The modem 1400 is a device that modulates and transmits a signal to transmit and/or receive wired and/or wireless data and demodulates the signal to recover an original signal at a receiving side. The I/O devices 1700a and 1700b may include devices that provide digital input and output functions, such as a Universal Serial Bus (USB) or storage, a digital camera, a Secure Digital (SD) card, a touch screen, a Digital Video Disk (DVD), a Network adapter, and the like.

The AP 1800 controls an overall operation of the mobile system 1000. In detail, the AP 1800 may control the display 1200 so that parts of contents stored in the flash memory devices 1600a and 1600b are displayed on the display 1200. Also, when a user input is received through the I/O devices 1700a and 1700b, the AP 1800 may perform a control operation corresponding to the user input.

The AP 1800 may be provided as a System-on-Chip (SoC) that drives an application program, an Operating System (OS), and the like. Alternatively, the AP 1800 and other semiconductor components, for example, the DRAM 1500a, a flash memory 1620, and/or a memory controller 1610, may be mounted using various types of packages. In other words, the AP 1800 and other semiconductor components may be mounted using packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), CERamic Dual In-line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-level Processed Stack Package (WSP), and the like.

A kernel of an operating system driven on the AP 1800 may include an input/output (I/O) scheduler and a device driver for controlling the flash memory devices 1600a and 1600b. The device driver may control access performances of the flash memory devices 1600a and 1600b or may control a CPU mode, a Dynamic voltage and Frequency Scaling (DVFS) level, and the like in an SoC with reference to the number of synchronous queues managed by the I/O scheduler.

In some embodiments, the AP 1800 may include an accelerator block or an accelerator chip 1820 that is a circuit only for an AI data operation. Therefore, the DRAM 1500b may be further mounted on the accelerator block or the accelerator chip 1820. The accelerator block or the accelerator chip 1820 is used to increase a performance index of the mobile system 1000 by accelerating a multitasking operation simultaneously loading a plurality of applications frequently occurring in the mobile system 1000, and switch and execution between the applications.

According to some embodiments, the mobile system 1000 may include a plurality of DRAMs 1500a and 1500b. In an embodiment, the AP 1800 may include a controller 1810, and thus, the DRAM 1500a may be directly connected to the AP 1800. The AP 1800 may control the DRAMs 1500a and 1500b through commands and MRS setting conforming to JEDEC standards or may communicate with the DRAMs 1500a and 1500b by setting DRAM interface protocols to use company-particular characteristics such as a low voltage, a high speed, reliability, and the like and Error Correction Code (ECC).

The DRAMs 1500a and 1500b have relatively smaller latency and bandwidth than the I/O devices 1700a and 1700b or the flash memory devices 1600a and 1600b. The DRAMs 1500a and 1500b may be initialized when the mobile system 1000 is powered on and may be loaded with operating system and application data to be used as temporary storage locations for the operating system and application data or may be used as execution spaces for various types of software code.

Four fundamental arithmetic operations of addition, subtraction, multiplication, and division and a vector operation, an address operation, or an FFT operation may be performed in the DRAMs 1500a and 1500b. Also, a function for performing an inference may be performed in the DRAMs 1500a and 1500b. Here, the inference may be performed in a deep learning algorithm using an artificial neural network. The deep learning algorithm may include a training stage of learning a model through various types of data and an inference stage of recognizing data with the learned model. For example, the function used for the inference may include a hyperbolic tangent function, a sigmoid function, a Rectified Linear Unit (ReLU) function, or the like. For example, the function used for the inference may be performed in the DRAM 1500b, and the accelerator block or the accelerator chip 1820 may perform an AI data operation based on data stored in the DRAM 1500b.

According to some embodiments, the mobile system 1000 may include a plurality of storages or a plurality of flash memory devices 1600a and 1600b having larger capacities than the DRAMs 1500a and 1500b. According to some embodiments, the accelerator block or the accelerator chip 1820 may perform the training stage and the AI data operation by using the flash memory devices 1600a and 1600b. According to embodiments, the AP 1800 may include an interface 1830, and thus the flash memory devices 1600a and 1600b may be directly connected to the AP 1800. For example, the AP 1800 may be embodied as an SoC, the flash memory device 1600a may be embodied as a separate chip, and the AP 1800 and the flash memory device 1600a may be assembled into one package. However, the inventive concept is not limited thereto, and the plurality of flash memory devices 1600a and 1600b may be electrically connected to the mobile system 1000 through a connection.

The flash memory devices 1600a and 1600b may store pictures captured through the camera 1100 or may store data transmitted through a data network, for example, Augmented Reality (AR)/Virtual Reality (VR), High Definition (HD), or Ultra High Definition (UHD) contents.

The DRAM 1500a may correspond to the memory device 100, 100A, or 100B described above with reference to FIGS. 1 through 16 and may include the PE 120. Also, the controller 1810 may correspond to the memory controller 200 described above with reference to FIGS. 1 through 16. For example, the user may capture an object through the camera 1100, and thus, the mobile system 1000 may perform image signal processing on an object image input through the camera 1100. An operation of the mobile system 1000 associated with image signal processing will now be described.

The controller 1810 in the AP 1800 may determine a PE enable mode and may provide the DRAM 1500a with a PE enable command indicating the determined PE enable mode. The DRAM 1500a may activate a PE enable signal in response to the PE enable command and thus may enter the PE enable mode, i.e., a PIM mode. Next, the controller 1810 may provide the DRAM 1500a with an active command, and the DRAM 1500a may activate wordlines included in each of the largest number of banks in response to the active command.

For example, PEs included in the DRAM 1500a may perform a data operation associated with an object image input through the camera 1100 and may provide the controller 1810 with a result of the data operation. The AP 1800 may generate an object recognition result associated with the object image based on the result of the data operation received from the controller 1810 and may provide the I/O device 1700a with the generated object recognition result. As another example, the PEs included in the DRAM 1500a may generate an object recognition result by performing a data operation associated with an object image input through the camera 1100 and may provide the controller 1810 with the generated object recognition result. The AP 1800 may provide the I/O device 1700a with the object recognition result received from the controller 1810.

While the inventive concepts have been particularly shown and described with reference to examples of embodiments thereof, it will be understood that various changes in form and details may be made therein without departing from the scope of the following claims.

What is claimed is:

1. A memory device comprising:
 a memory cell array including a plurality of banks;
 a plurality of Processing Elements (PEs), each PE connected to a corresponding bank among the plurality of banks; and
 a control logic configured to:
  control an active operation, in which at least two wordlines included in the plurality of banks are activated and at least two PEs corresponding to the at least two wordlines are enabled, in response to a PE enable signal, and control the at least two enabled PEs so that at least two data read from memory cells coupled to the at least two wordlines are processed in the at least two enabled PEs in parallel, and
  control a refresh operation in which at least one bank of the plurality of banks is refreshed, while the at least two wordlines are activated.

2. The memory device of claim 1, wherein the control logic is further configured to activate the wordlines included in the plurality of banks in response to an active command received during a PE enable mode in which the PE enable signal is activated.

3. The memory device of claim 1, wherein the control logic is further configured to activate wordlines included in each of banks on which the refresh operation is not performed in response to an active command received during a PE enable mode in which the PE enable signal is activated.

4. The memory device of claim 1, wherein the control logic is further configured to activate a wordline included in one of the plurality of banks in response to an active command received during a PE disable mode in which the PE enable signal is inactivated.

5. The memory device of claim 1, wherein the control logic is further configured to receive a PE enable command from a memory controller and generate the PE enable signal based on the received PE enable command.

6. The memory device of claim 1, wherein the control logic comprises a PE enable signal generator configured to receive a command and an address from a memory controller and configured to generate the PE enable signal based on the received command and the received address.

7. The memory device of claim 1, wherein the control logic comprises a refresh control unit configured to generate refresh signals respectively corresponding to the plurality of banks based on a refresh command and a bank address.

8. The memory device of claim 7, wherein the control logic further comprises an active control unit configured to generate active signals respectively corresponding to the plurality of banks based on an active command, the bank address, the refresh signals, and the PE enable signal.

9. The memory device of claim 8, wherein the control logic further comprises wordline enable controllers configured to respectively generate wordline enable signals respectively corresponding to the plurality of banks based on the active signals and the refresh signals.

10. The memory device of claim 7, wherein the control logic is further configured to, when a first refresh signal of the refresh signals is activated, activate a wordline included in a first bank corresponding to the first refresh signal among the plurality of banks.

11. The memory device of claim 1, wherein the plurality of PEs are respectively connected to the plurality of banks.

12. The memory device of claim 1, wherein the plurality of banks are grouped into a plurality of bank groups, and wherein the plurality of PEs are respectively connected to the plurality of bank groups.

13. A memory device comprising:
 a memory cell array including a plurality of banks;
 a plurality of Processing Elements (PEs) respectively connected to the plurality of banks;
 a refresh control unit configured to generate refresh signals for controlling refresh operations respectively on the plurality of banks; and
 an active control unit configured to activate a wordline included in at least one selected bank from the plurality of banks according to an active command and according to the refresh signals during a PE enable mode in which the plurality of PEs are enabled,
 wherein at least two wordlines included in the plurality of banks are activated and at least two PEs corresponding to the at least two wordlines are enabled, in response to receiving the active command, and at least two data read from memory cells coupled to the at least two wordlines are processed in the at least two enabled PEs in parallel after receiving the active command.

14. The memory device of claim 13, wherein the refresh control unit is further configured to generate the refresh signals based on a refresh command and a bank address.

15. The memory device of claim 13, wherein the active control unit is further configured to generate active signals respectively corresponding to the plurality of banks based on a bank address, the active command, the refresh signals, and a PE enable signal indicating the PE enable mode.

16. The memory device of claim 15, further comprising wordline enable controllers configured to respectively generate wordline enable signals respectively corresponding to the plurality of banks based on the active signals and the refresh signals.

17. A memory system comprising:
 a memory device comprising a plurality of banks and a plurality of Processing Elements (PEs); and
 a memory controller configured to provide the memory device with an active command and a refresh command,
 wherein the memory device is configured to activate at least two wordlines included in the plurality of banks and enable at least two PEs corresponding to the at least two wordlines, in response to receiving the active command during a PE enable mode in which the at least two PEs are enabled, and control the at least two enabled PEs so that at least two data read from memory cells coupled to the at least two wordlines are processed in the at least two enabled PEs in parallel.

18. The memory system of claim 17, wherein the memory device is further configured to perform a refresh operation on less than all of the plurality of banks in response to the refresh command, and wherein the memory device is further configured to activate wordlines included in each of banks on which the refresh operation is not performed in response to receiving the active command during the PE enable mode.

19. The memory system of claim 18, wherein the memory controller comprises a PE enable mode controller configured to control a state of the PE enable mode, and wherein the memory controller is configured to provide the memory device with a command indicating the state of the PE enable mode and an address.

20. The memory system of claim 17, wherein the memory controller is configured to provide the memory device with a PE enable command initiating the PE enable mode.

\* \* \* \* \*